United States Patent
Killian et al.

(10) Patent No.: US 7,257,038 B2
(45) Date of Patent: Aug. 14, 2007

(54) TEST MODE FOR IPP CURRENT MEASUREMENT FOR WORDLINE DEFECT DETECTION

(75) Inventors: Michael A. Killian, Richmond, VT (US); Martin Versen, Burlington, VT (US); Grant McNeil, Williston, VT (US); Zach Johnson, Williston, VT (US); Changduk Kim, South Burlington, VT (US)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 11/322,252

(22) Filed: Jan. 3, 2006

(65) Prior Publication Data

US 2007/0153596 A1 Jul. 5, 2007

(51) Int. Cl.
*G11C 7/00* (2006.01)
(52) U.S. Cl. ............. 365/201; 365/185.09; 365/230.06
(58) Field of Classification Search ................ 365/200, 365/201, 230.06, 185.09
See application file for complete search history.

(56) References Cited

U.S. PATENT DOCUMENTS

| | | | | |
|---|---|---|---|---|
| 5,786,702 A | * | 7/1998 | Stiegler et al. | ............. 324/763 |
| 5,848,018 A | * | 12/1998 | McClure | ..................... 365/201 |
| 6,781,902 B2 | * | 8/2004 | Oumiya et al. | ............. 365/201 |
| 7,158,415 B2 | * | 1/2007 | Bedarida et al. | ......... 365/185.2 |
| 2002/0054514 A1 | * | 5/2002 | Kajigaya et al. | ....... 365/189.02 |

* cited by examiner

*Primary Examiner*—Gene N. Auduong
(74) *Attorney, Agent, or Firm*—Edell, Shapiro & Finnan, LLC

(57) ABSTRACT

A semiconductor integrated circuit memory device, and test method for a memory device are provided in which an external wordline voltage is applied to a wordline of the memory device. A current on the wordline is measured as a result of application of the externally supplied wordline voltage. The measured current is compared to a reference value to determine whether the wordline has a defect, in particular a short-circuit defect. A tester device is connected to the memory device and supplies the external wordline voltage. The current measurement and comparison may be made internally by circuitry on the memory device or externally by circuitry in a tester device.

23 Claims, 9 Drawing Sheets

TEST MODE FOR IPP CURRENT MEASUREMENT FOR WORDLINE DEFECT DETECTION

BACKGROUND OF THE INVENTION

The present invention is directed to semiconductor devices, and more particularly to testing semiconductor memory devices for defects.

Defects in semiconductor integrated circuit memory devices, such as dynamic random access memory (DRAM) devices, are tested for during production at different stages. Defects in the devices that are detected after completed manufacturing and before integrated circuit packaging are "repaired" by the use of redundant elements. Defects that are detected after packaging lead to rejection of the device.

Currently, defects such as wordline-bitline short-circuits are detected by functional test patterns that compare expected data against actual data. If mismatches occur, the corresponding addresses are stored. A bitmap such as the one shown in FIG. 1 would be identified as a wordline-bitline short either by a redundancy algorithm or by bitmap analysis, and the bitmap shown in FIG. 2 might be recognized as a wordline-wordline short-circuit.

With current testing techniques, the ability to detect a defect depends on the nature of the resistive short. High resistive shorts reduce the signal margin only for the cells on the shorted bitline so that a bitline-oriented failure may be possibly detected. Such a testing technique is not reliable because only a secondary effect is measured. Furthermore, this approach makes defect localization very difficult and requires time consuming analysis techniques to localize a defective wordline because if only a bitline oriented defect is detected, it is not clear from which deactivated wordline the leakage originates.

SUMMARY OF THE INVENTION

Briefly, a semiconductor integrated circuit memory device, and test method for a memory device are provided in which an external wordline voltage is applied to a wordline of the memory device. A current on the wordline is measured as a result of application of the externally supplied wordline voltage. The measured current is compared to a reference value to determine whether the wordline has a defect, in particular a short-circuit defect. A tester device is connected to the memory device and supplies the external wordline voltage. The current measurement and comparison may be made internally by circuitry on the memory device or externally by circuitry in a tester device.

DETAILED DESCRIPTION

Figure 3:
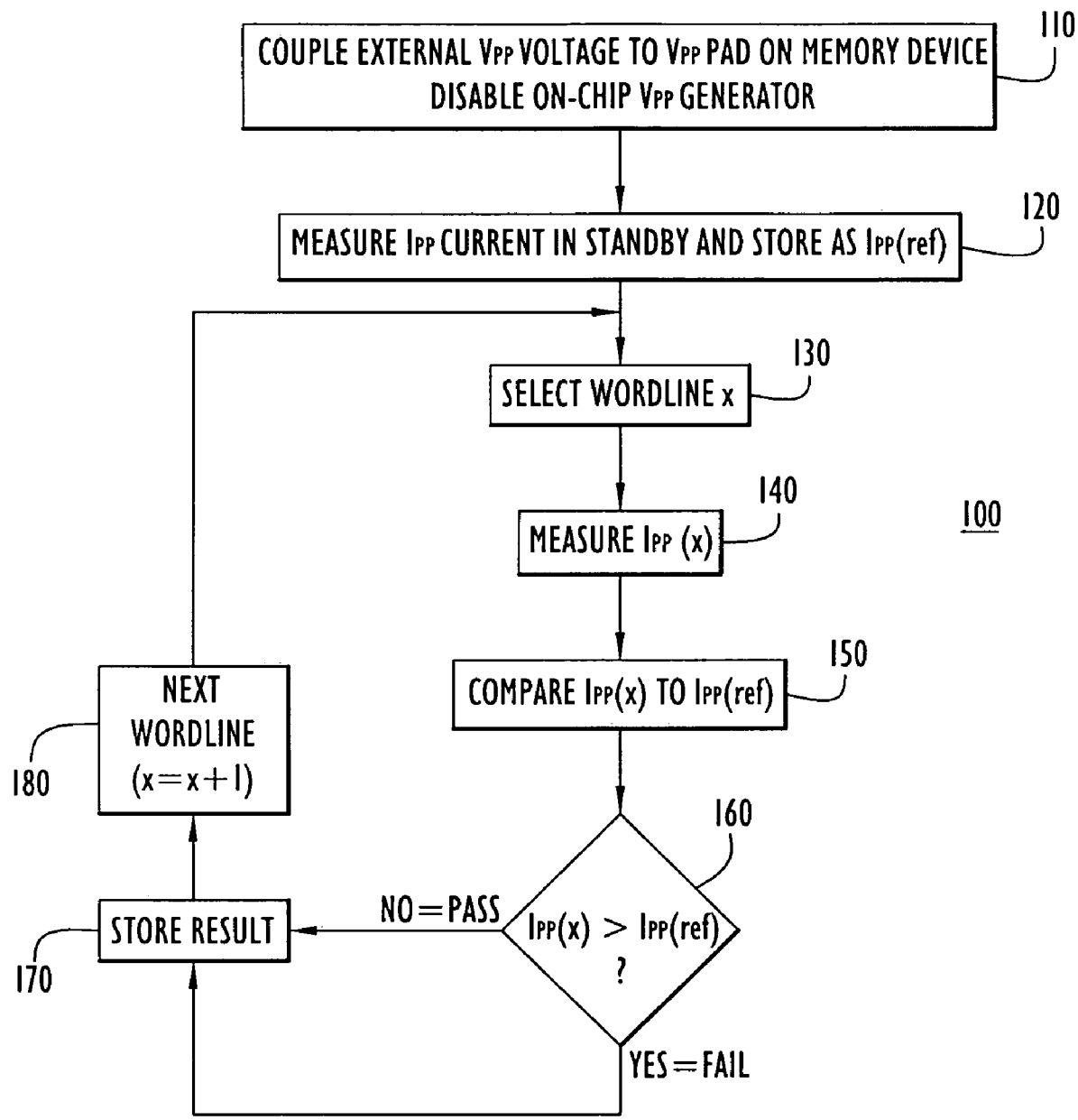
FIG. 3 is a flow chart generally depicting steps of a method for making an $I_{pp}$ current measurement to detect wordline defects according to an embodiment of the present invention.
Figure 4:
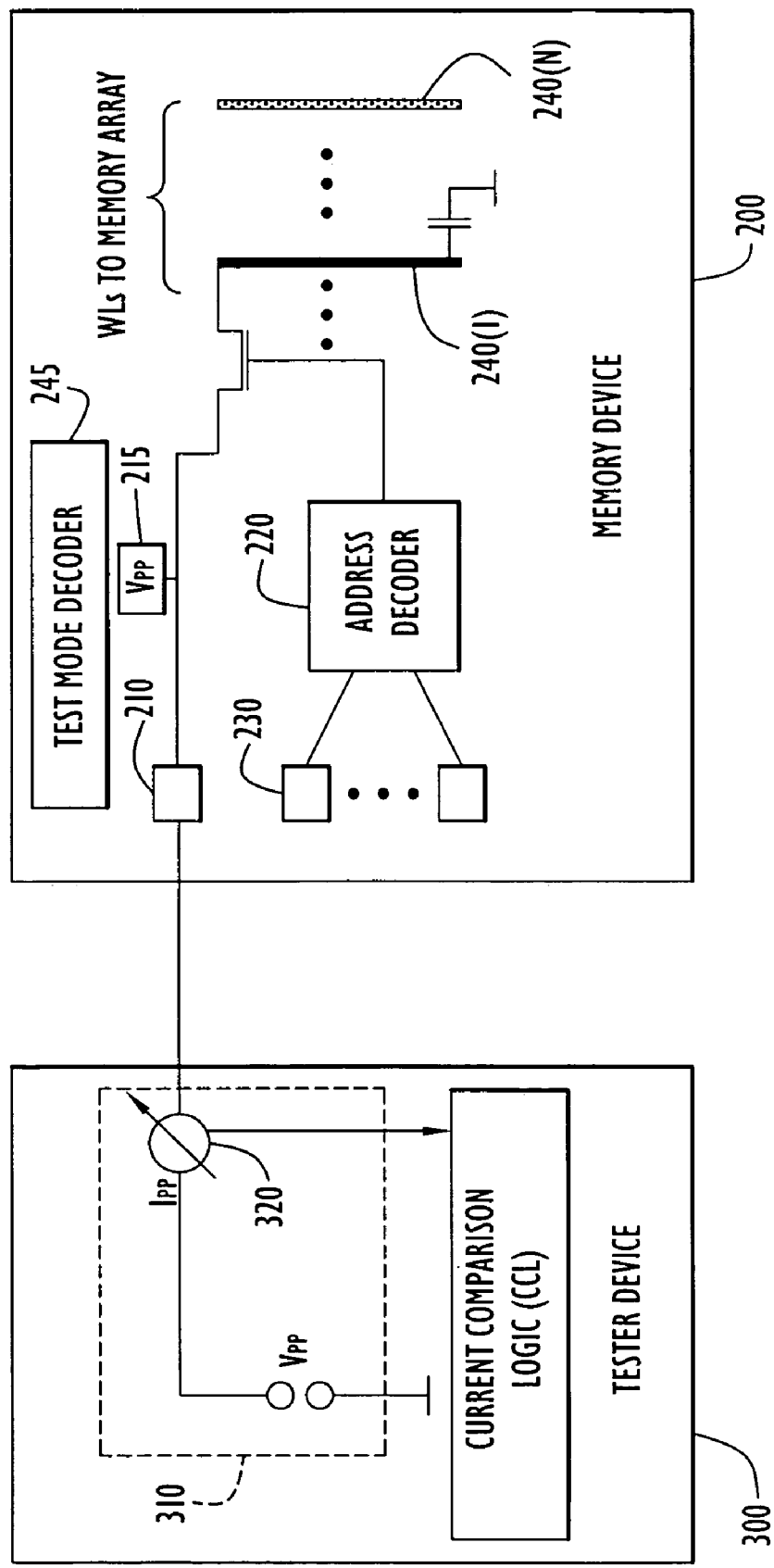
FIG. 4 is a block diagram of a configuration for making $I_{pp}$ current measurements according to one embodiment of the invention.
Figure 5:
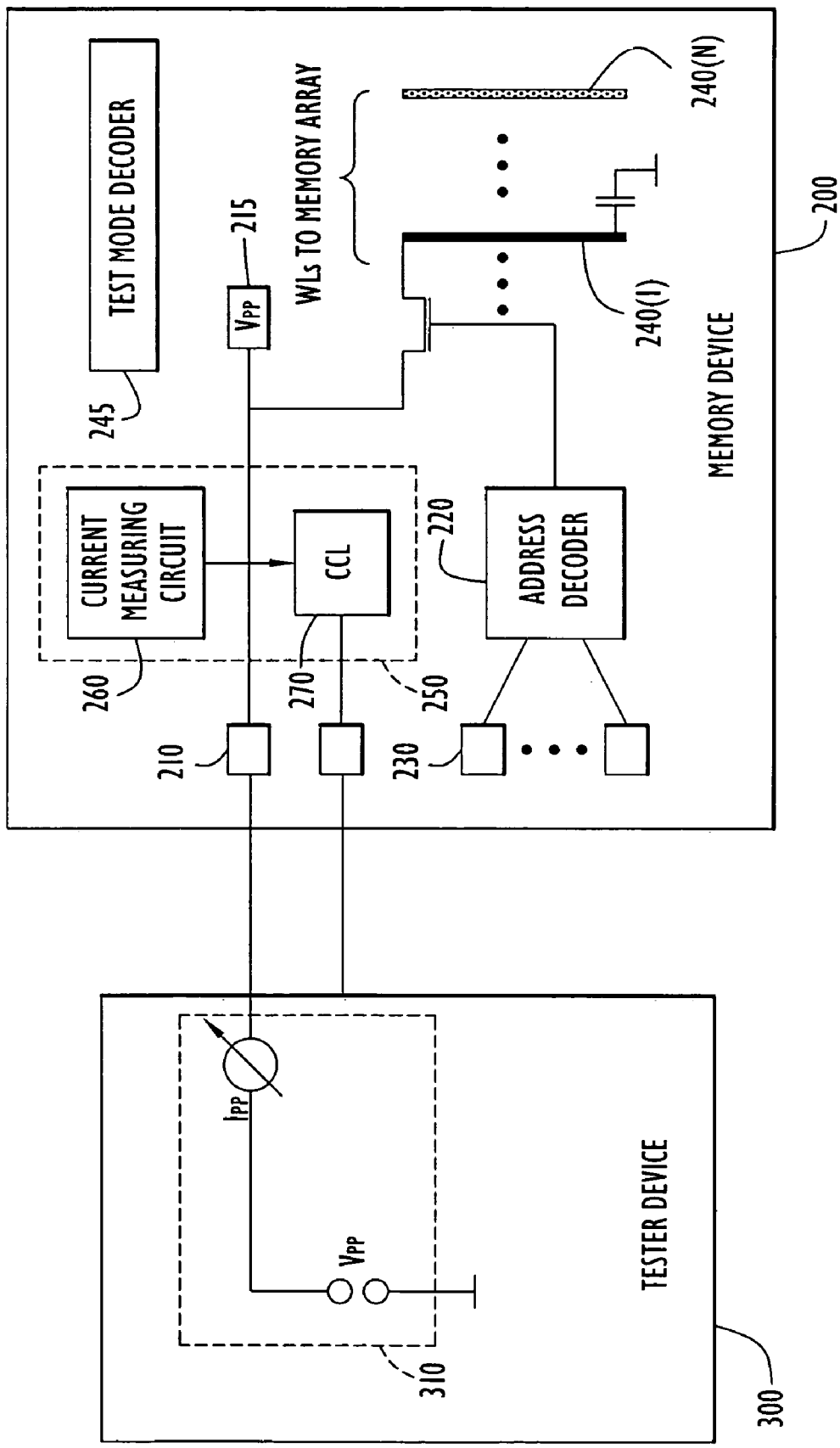
FIG. 5 is a block diagram of a configuration for making $I_{pp}$ current measurements according to another embodiment of the invention.

Reference is made first to FIG. 3, which depicts a method 100 to make $I_{pp}$ current measurements for each wordline in a semiconductor memory device. FIG. 4 shows a configuration for making the $I_{pp}$ current measurements off-chip and FIG. 5 shows a configuration for making the $I_{pp}$ current measurements on-chip. FIGS. 4 and 5 are described hereinafter. The method 100 is followed whether the $I_{pp}$ current measurements are made on-chip or off-chip in a tester device.

The $I_{pp}$ current measurement method 100 applies a current measurement to the wordline voltage $V_{pp}$. In step 110, a test mode command is supplied to the memory device and in response to the command the memory device disables the on-chip wordline voltage $V_{pp}$ generator and an external wordline voltage is supplied to the $V_{pp}$ pad, such as from a tester device during a wafer test. In step 120, a reference IPP current is determined. For example, after the memory device is powered up and in the test mode state, and in response to the corresponding test mode command, the $I_{pp}$ current is measured from any given wordline in the device or from a number of wordlines in a precharged state or deactivated (standby) state. The lowest or average current measurement is determined from the measurements made from each of the wordlines and used as the $I_{pp}$ reference value, plus some additional limit value to account for measurement inaccuracies. It should be understood that this reference $I_{pp}$ current value may be made before or after all of the individual wordline $I_{pp}$ current measurements are made. This reference $I_{pp}$ current is stored either externally in the tester device (FIG. 4) or internally in the memory device (FIG. 5). As is known the art of DRAM design, the $I_{pp}$ current for an active and a precharged (standby) wordline should be the same if the wordline has no short-circuits associated with it.

Next, in step 130, a wordline is selected, wordline x (where x is a wordline address), and the externally supplied wordline voltage $V_{pp}$ is coupled to that wordline. In step 140, the $I_{pp}$ current for wordline x, $I_{pp}(x)$ is measured after the selected wordline is activated by connection to the externally supplied wordline voltage $V_{pp}$ and a certain wait time. If the wordline has a short-circuit associated with it, when the external $V_{pp}$ voltage is supplied to it, an additional current will need to be supplied from the external tester device in order to establish the $V_{pp}$ voltage on the wordline because the short-circuit will draw away some of the current, causing the measured $I_{pp}$ current to be higher for such a wordline. Again, this current measurement may be made externally in a tester device (FIG. 4) or internally on the memory device (FIG. 5). In step 150, a comparison is made between $I_{pp}(x)$ and the reference $I_{pp}$ value, $I_{pp}(ref)$. In step 160, if $I_{pp}(x)$ is greater than $I_{pp}(\text{ref})$ then wordline x is said to have a short-circuit failure or defect and if $I_{pp}(x)$ is less than or equal to $I_{pp}(\text{ref})$, then wordline x passes the test. The test result may be stored (externally or internally) in step 170 and then the next wordline to be measured is computed in step 180. Steps 130-170 are repeated until all the wordlines to be tested have been tested. It should be understood that all of the wordline specific $I_{pp}$ current measurements may be made and stored first and subsequently the comparisons made between each $I_{pp}(x)$ current measurement and the $I_{pp}$ reference value, $I_{pp}(\text{ref})$, to determine which wordlines are bad and good.

Turning to FIG. 4, an embodiment will be described for externally making an $I_{pp}$ current measurement during a test procedure, where the current measurements are made in a tester device 300 that connects to a memory device 200 under test. The memory device 200 comprises a $V_{pp}$ pad 210 to which the externally supplied $V_{pp}$ voltage is connected. An on-chip $V_{pp}$ generator is shown at 215 and this is disabled when the $I_{pp}$ current test mode is executed. There is an address decoder 220 that is connected to a plurality of address pins 230. The address decoder 220 is also coupled to the wordlines 240(1) to 240(N) in the memory array and, based on an address supplied to it, selects one of the wordlines 240(1) to 240(N) for connection to the externally supplied wordline voltage $V_{pp}$. In addition, there is a test mode decoder 245 that decodes test mode commands supplied by the tester device 300. In particular, the test mode decoder 250 decodes an $I_{pp}$ wordline current measurement test mode command to disable the on-chip $V_{pp}$ voltage generator and use the externally supplied $V_{pp}$ voltage for driving wordlines for the $I_{pp}$ current measurements. The tester device 300 may also supply to the memory device the wordline address to be selected by the address decoder 245 for connection to the wordline voltage $V_{pp}$, or there is test mode logic in the memory device 200 that supplies the wordline addresses to the address decoder 220 during the wordline $I_{pp}$ current test mode. The tester device 300 would also supply the test mode command to the memory device 200 and the test mode decoder 245 is responsive to configure the memory device to make an $I_{pp}$ current measurement from at least one wordline (or several wordlines as described above) that is in a deactivated or precharged state for purposes of determining $I_{pp}(\text{ref})$.

The tester device 300 is the source of $V_{pp}$ and to this end includes a power supply 310 that generates the wordline voltage $V_{pp}$ and includes a variable current source 320 that supplies the amount of current needed to maintain the $V_{pp}$ voltage on a selected wordline. Thus, the circuit 320 in the power supply 310 will maintain a measure of the $I_{pp}$ current for the selected wordline. The tester device 300 also includes current comparison logic 270 that compares the wordline specific $I_{pp}$ currents, $I_{pp}(x)$, with a stored $I_{pp}(\text{ref})$ value determined at the onset or after the wordline $I_{pp}$ current measurements are made. The current comparison logic 270 is described hereinafter in conjunction with FIG. 6.

Referring now to FIG. 5, an embodiment is described for internally making $I_{pp}$ current measurements during a test procedure. In this embodiment, the memory device 200 includes circuitry needed to make the $I_{pp}$ current measurements on-chip rather than in a tester device 300. The tester device 300 still supplies the wordline voltage $V_{pp}$ to the $V_{pp}$ pad 210 (and the needed amount of current to establish the $V_{pp}$ voltage) for the $I_{pp}$ current measurements. To this end, there is a current measurement and test mode logic block 250 in the memory device 200 connected to the $V_{pp}$ pad 210 and to a selected one of the wordlines 240(1) to 240(N). The current measurement and test mode logic block 250 comprises a current measuring circuit 260 and the current comparison logic 270. The current measuring circuit 260 may comprise, as an example, a current mirror circuit that mirrors the $I_{pp}$ current on the selected wordline to the current comparison logic 270. Other circuits may be used to measure the current on the selected wordline.

Figure 6:
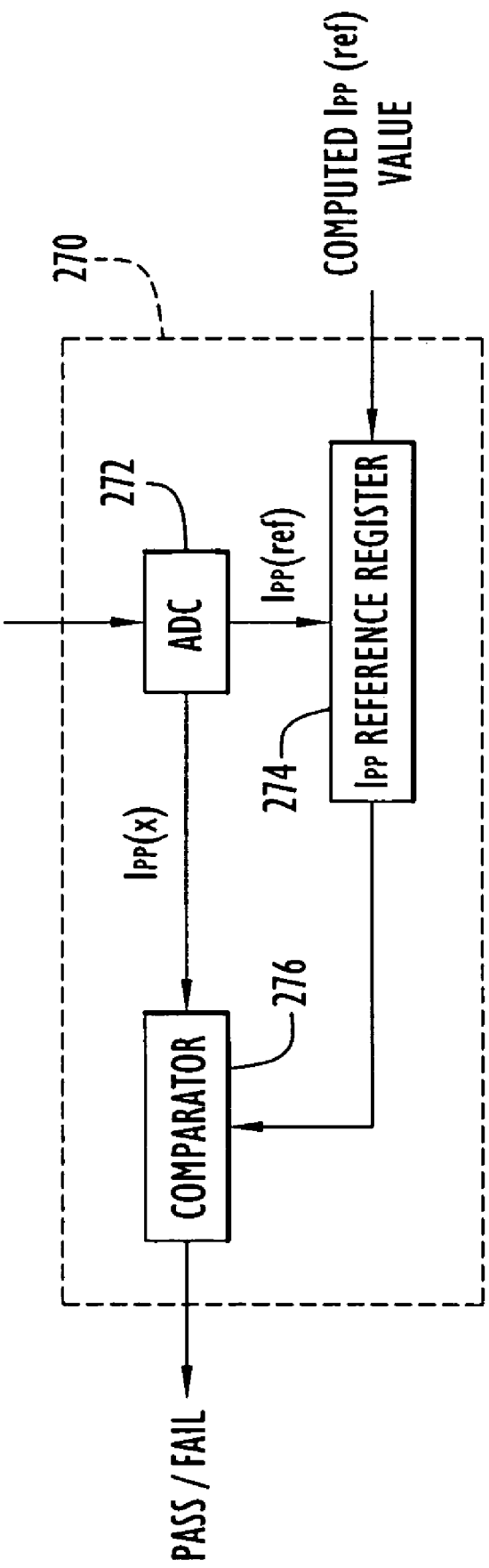
FIG. 6 is a block diagram of circuitry for comparing a measured $I_{pp}$ current with a reference according to an exemplary embodiment of the present invention.

Reference is now made to FIG. 6 for a description of the current comparison logic 270 that is in the memory device 200 for the embodiment of FIG. 5 and in the tester device for the embodiment of FIG. 4. The current comparison logic 270 comprises an analog-to-digital converter (ADC) 272, a register 274 for storing an $I_{pp}$ reference value, $I_{pp}(\text{ref})$ and a comparator 276. The comparator 276 is for example, an operational amplifier circuit. The ADC 272 converts the $I_{pp}$ current measurement to a digital signal (e.g., binary value). If the $I_{pp}$ current that is measured is to be used as a reference value, then it is stored in the register 274. Alternatively, a series of $I_{pp}$ current measurements can be made and analyzed by an on-chip or off-chip (in the tester device 300) computation circuit (not shown) that computes an average or a lowest value and stores that value (plus a limit value) to the register 274.

The operation of the current comparison logic is as follows. The comparator 276 compares the current $I_{pp}(x)$ with $I_{pp}(\text{ref})$ and if $I_{pp}(x)$ is greater than $I_{pp}(\text{ref})$, the wordline x is said to have failed the test (i.e., has a short-circuit defect) and if $I_{pp}(x)$ is less than or equal to $I_{pp}(\text{ref})$, then wordline x is said to have passed the test. If desired, provision may be made on the memory device 200 for storing the results of the tests (and the current measurements $I_{pp}(x)$) on-chip. The test results and/or the $I_{pp}(x)$ current measurements may also be supplied to the tester device 300 for storage and further analysis.

The tester device 300 supplies an $I_{pp}$ wordline current measurement test mode command that the test mode decoder 245 recognizes. The test mode decoder 245 responds to this command by disabling the on-chip $V_{pp}$ voltage generator and uses the externally supplied $V_{pp}$ voltage for the current measurements. In response to a further test mode command, the $I_{pp}$ reference value $I_{pp}(\text{ref})$ is determined with the memory device 200 in a standby or precharge state as described above, and is stored in the register 274. Next, a wordline is selected by supplying an address to the address decoder 220 and the voltage $V_{pp}$ is applied to the selected wordline so that the $I_{pp}$ current, $I_{pp}(x)$, for the selected wordline is measured by the current measurement circuit 260. The addresses may be supplied by the tester device 300, or test mode logic in the memory device 200 may cycle through the addresses based on internally programmed commands for this test mode. In the embodiment of FIG. 4, the $I_{pp}$ current measurements are made off-chip in the tester device as described above. In the embodiment of FIG. 5, the $I_{pp}$ current measurements are made on-chip with the current measuring circuit 260.

Figure 10:
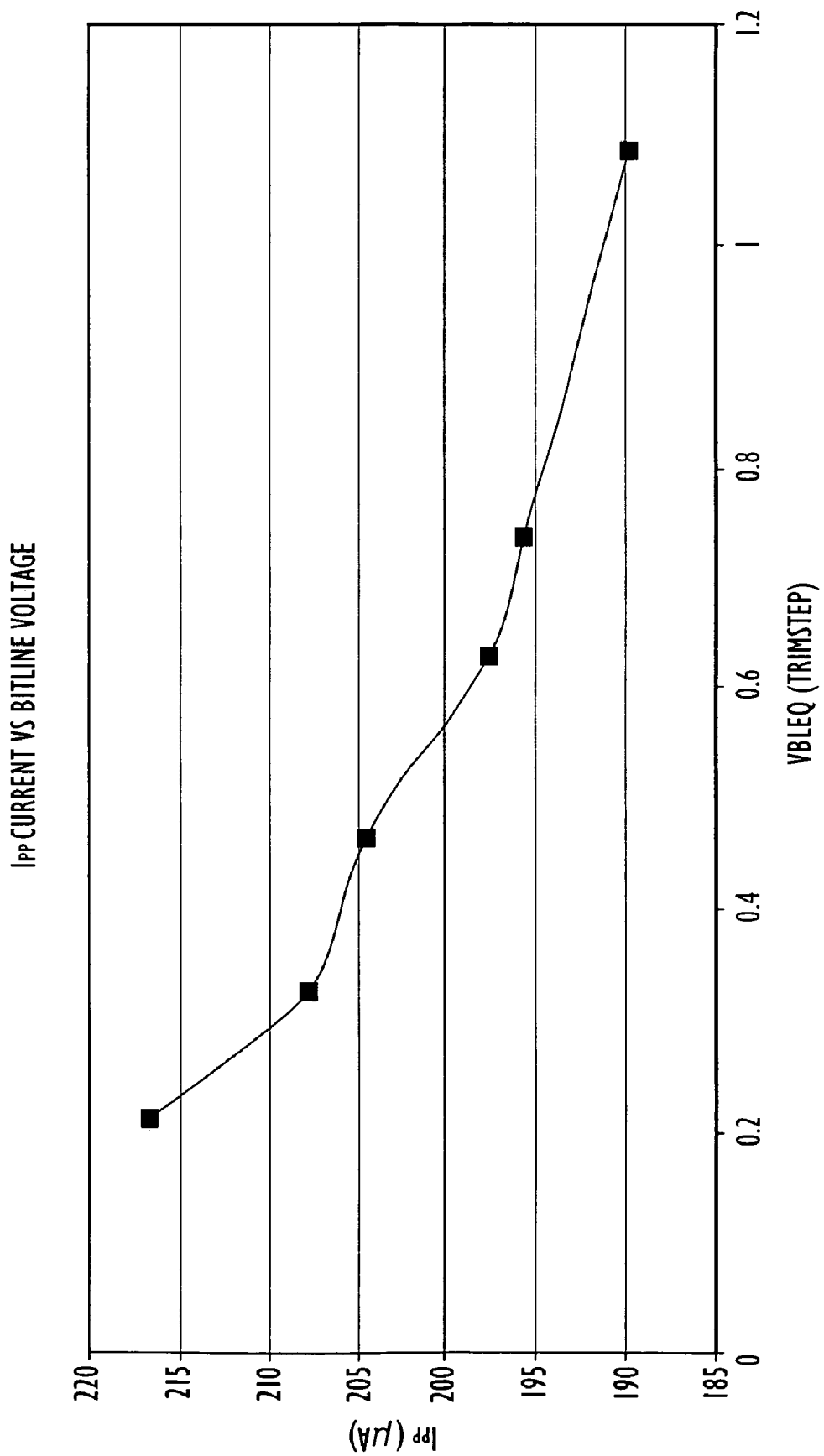
FIG. 10 is a plot showing a dependence of $I_{pp}$ current on bitline voltage for a particular wordline for data obtained using the techniques of the present invention.

A test mode procedure may involve two stages of tests. During the first stage, the $I_{pp}$ currents of the wordlines are measured and compared with $I_{pp}(\text{ref})$ to determine the addresses of any wordlines whose $I_{pp}(x)$ exceed $I_{pp}(\text{ref})$. The second stage involves making $I_{pp}$ current measurements for the those wordlines whose $I_{pp}(x)$ exceed $I_{pp}(\text{ref})$ under a certain bias condition: the bitline voltages are set to different values so that a wordline-bitline short can be distinguished from a wordline-wordline short. If the wordline current varies with bitline voltage, then the defect on the wordline can be classified as a wordline-bitline short, otherwise it is a wordline-wordline short. Exemplary data for the second stage test is shown in FIG. 10, described hereinafter. To repeat, in order to distinguish a wordline-wordline short from a wordline-bitline short, for a wordline whose measured current exceeds the reference value, a further test is made by applying each of a plurality of different bitline voltages and measuring the current on the wordline at each of the plurality of different bitline voltages.

Reference is now made to FIGS. 7-10 that depict exemplary test data for a semiconductor memory device.

Figure 2:
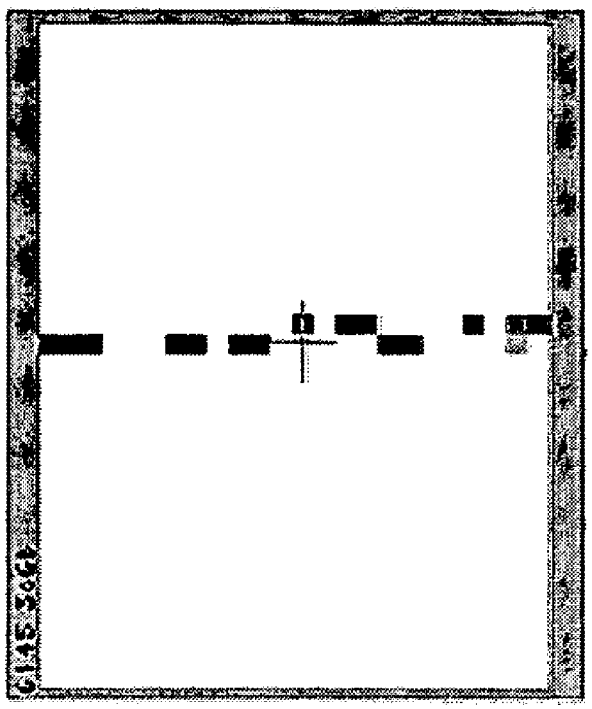
FIGS. 1 and 2 are screen shot bitmap images of exemplary functional test results for a semiconductor integrated circuit memory device using prior art testing techniques.
Figure 1:
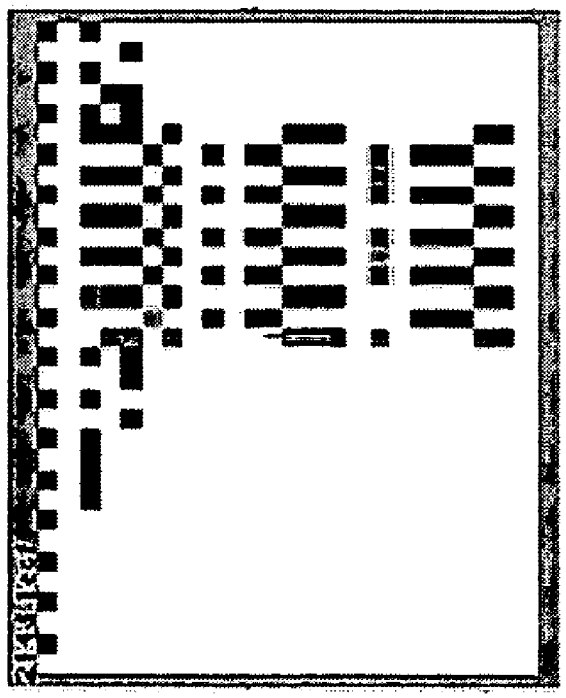
Figure 7:
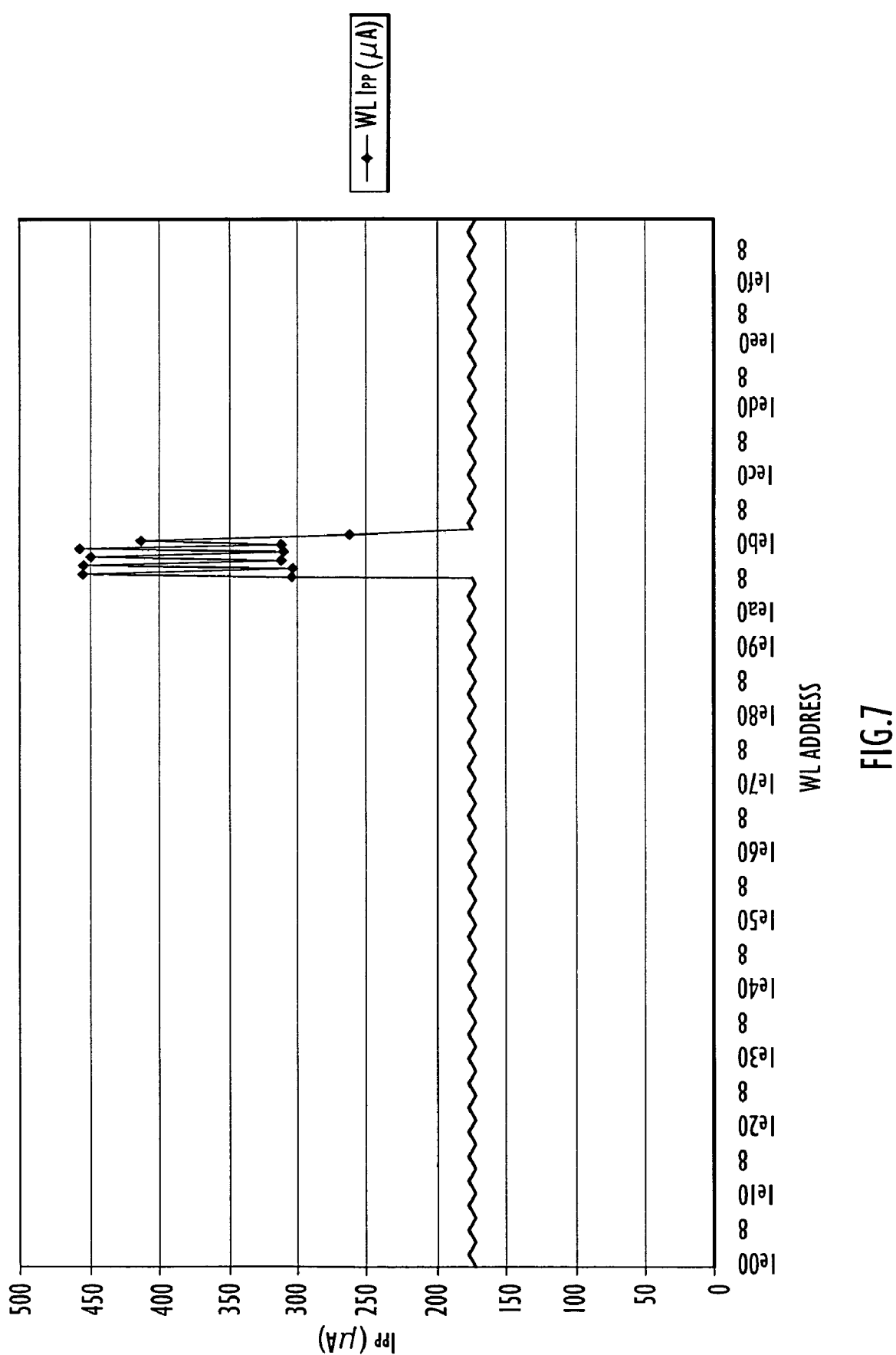
FIG. 7 is a plot showing tested wordline number versus measured $I_{pp}$ current according to the present invention for the same memory device as the bitmap shown in FIG. 1.
Figure 8:
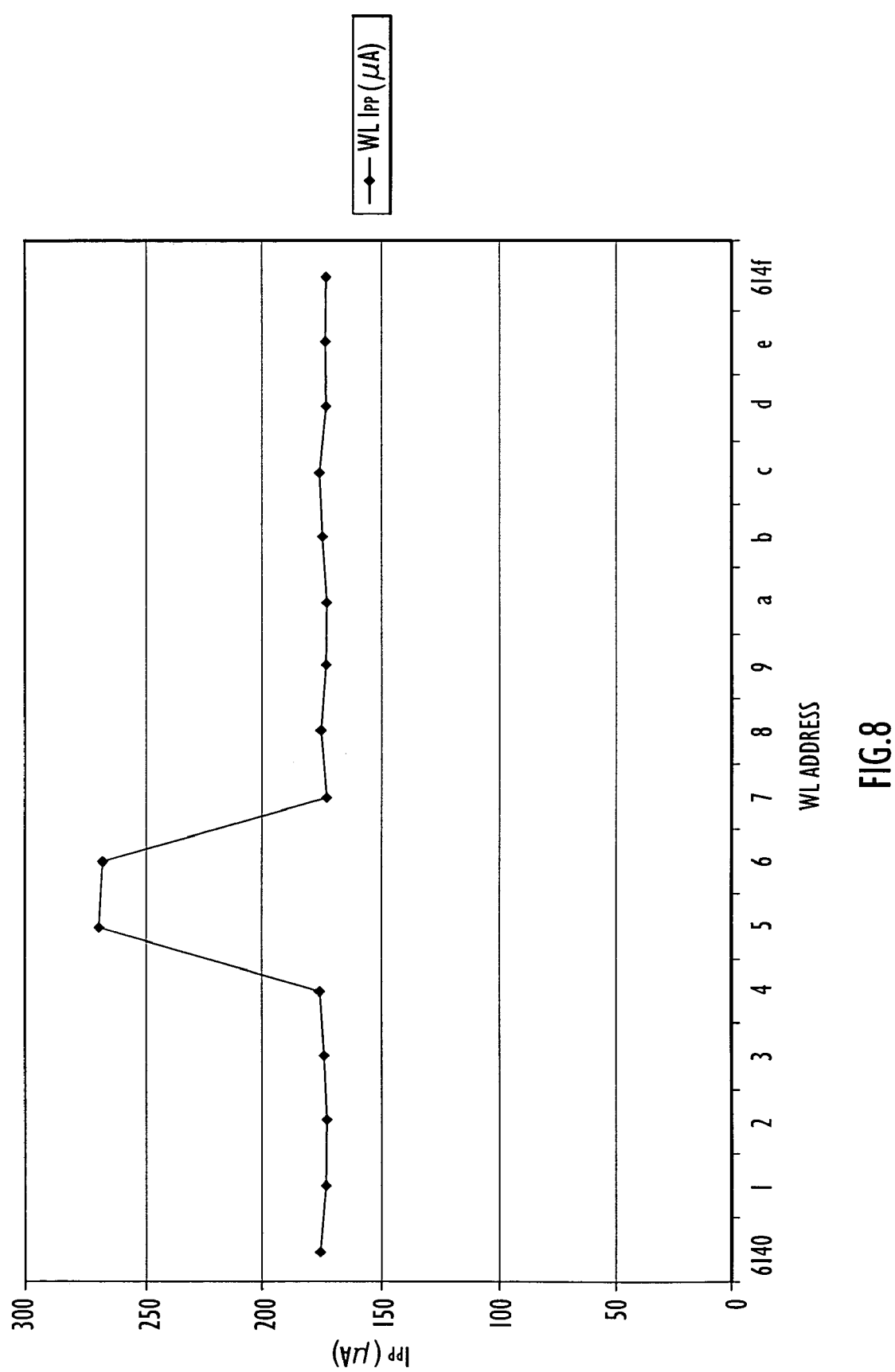
FIG. 8 is a plot showing tested wordline number versus measured $I_{pp}$ current according to the present invention for the same memory device as the bitmap shown in FIG. 2.

FIG. 7 illustrates $I_{pp}(x)$ current measurements for the bitmap test result data shown in FIG. 1 and FIG. 8 illustrates the $I_{pp}(x)$ current measurements for the bitmap test result data shown in FIG. 2. The wordline addresses x=1ea8 to x=1eb2 in FIG. 7 and x=6145 and 6146 in FIG. 8 have a higher $I_{pp}$ current and are detected as bad or defective wordlines.

Figure 9:
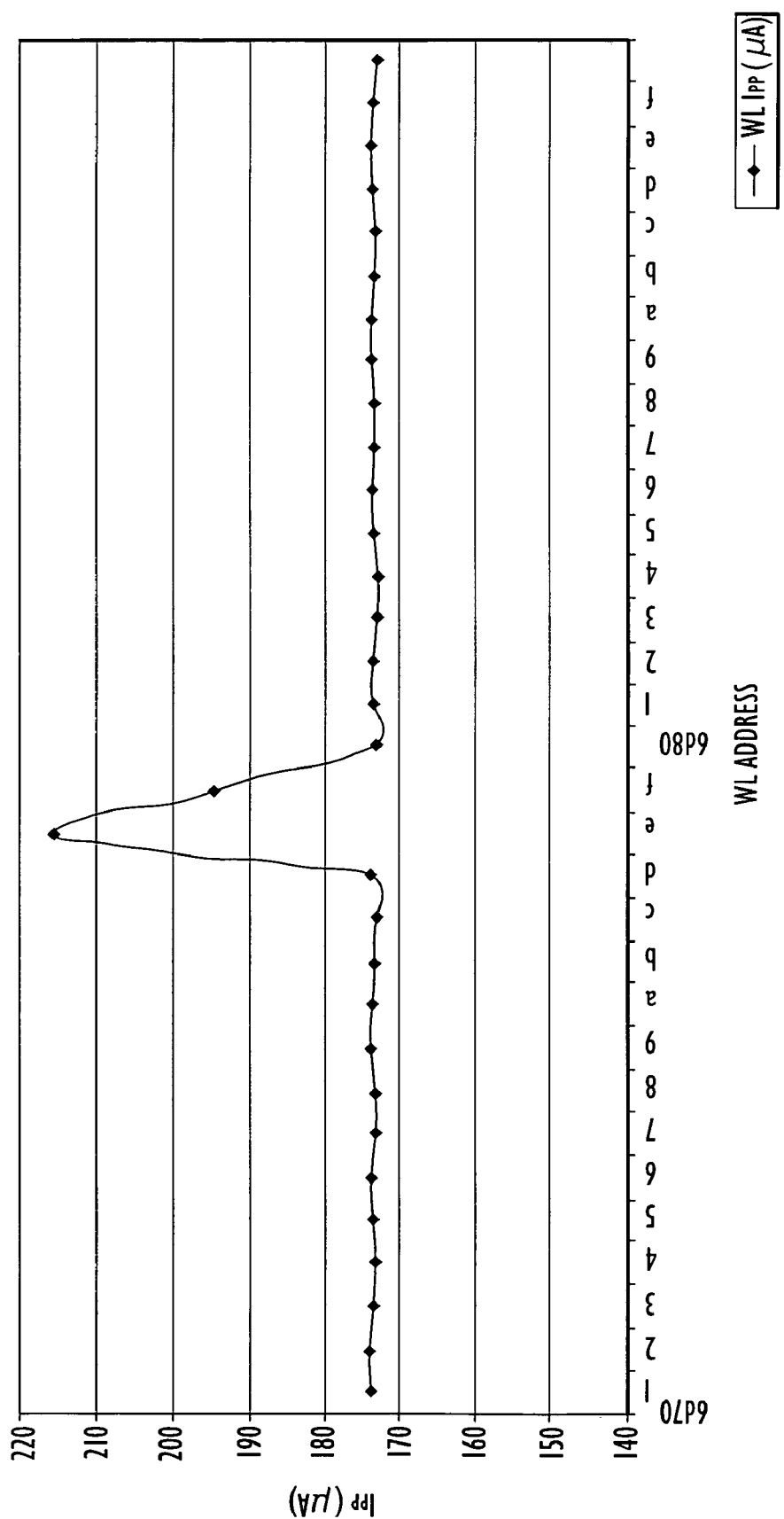
FIG. 9 is a plot showing tested wordline number versus measured $I_{pp}$ current made on a memory device according to the techniques of this invention.

FIG. 9 illustrates a plot of current measurements for a defect not evident by the bitmaps of FIGS. 1 and 2. Defects are found to occur at wordlines addresses 6d7d and 6d7e.

The current $I_{pp}(x)$ may be stored together with the address of the wordline x as row values in an array variable xFAIL, for example. The dimension of the array is the maximum number of wordlines and the array is initialized with zero values. In the event that a failure is detected, the wordline address x is stored as a value in xFAIL and a fail counter is incremented by 1. In the example of FIGS. 7-9, the xFAIL variable would be xFAIL=(1ea8, 1ea9, 1eaa, 1eab, 1eac, 1ead, 1eae, 1eaf, 1eb0, 1eb1, 1eb2, 6145, 6146, 6d7d, 6d7e, 0, 0, 0, . . . 0), and the fail counter would be 15.

FIG. 10 shows data for $I_{pp}$ current measurement at wordline (6d7d) at different bitline voltages. When a resistive behavior is observed from the further $I_{pp}$ current measurements made on a wordline at different bitline voltages, the defect on this wordline is classified as a wordline-bitline short. A repetition of $I_{pp}$ current measurement for wordline (6145) (no plot shown) does not show any bitline voltage dependency and is therefore classified as a non-wordline-bitline short.

The current measurement data shown in FIGS. 7-9 already have this information implicitly. The current measurement values for the rows 1ea8 to 1eb2 alternate between 300 μA and 450 μA depending on the address. If the row is connected to a bitline that was amplified to GND, the measured current is higher, 450 μA. If the row is connected to VBLH, the measured current is lower, 300 μA. The same is true for rows 6d7d and 67de, although it is not so obvious because there are just two addresses. The two rows in FIG. 8 with increased IPP current do not show a current difference so they are most probably wordline-wordline shorts.

The system and methods described herein may be embodied in other specific forms without departing from the spirit or essential characteristics thereof. The foregoing embodiments are therefore to be considered in all respects illustrative and not meant to be limiting.

What is claimed is:

1. A method for testing for defects of an integrated circuit memory device, comprising:
   a. disabling an on-chip wordline voltage source such that all wordlines are in a deactivated state;
   b. connecting an external wordline voltage source to the memory device;
   c. connecting a voltage from the external wordline voltage source to a wordline and measuring a current on the wordline as a result; and
   d. comparing the current with a reference value to determine whether the wordline has a defect.

2. The method of claim 1, wherein measuring and comparing are performed in the memory device.

3. The method of claim 1, wherein measuring and comparing are performd in a device external to said memory device.

4. The method of claim 1, and further comprising determining that the wordline has a short-circuit defect when the measured current is greater than the reference value.

5. The method of claim 1, and further comprising determining the reference value by measuring a current on at least one wordline in a deactivated or precharged state.

6. The method of claim 1, wherein said connecting the voltage from the external wordline voltage source and said measuring are performd one wordline at a time.

7. The method of claim 6, wherein for a wordline whose measured current exceeds the reference value, further comprising applying each of a plurality of different bitline voltages and measuring the current on the wordline at each of the plurality of different bitline voltages to distinguish a wordline-wordline short-circuit from a wordline-bitline short-circuit.

8. A method for testing for defects of an integrated circuit memory device, comprising:
   a. selecting a wordline of the memory device to be tested;
   b. applying an externally supplied voltage to the selectd wordline of the memory device;
   c. measuring a current on the selected wordline as a result of application of said externally supplied voltage;
   d. comparing the measured current with a reference value that is derived from a measured current on one or more deactivated wordlines to determine whether the wordline has a defect; and
   e. repeating (a) through (d) for each of a plurality of wordlines of the memory device.

9. The method of claim 8, and further comprising disabling an on-chip wordline voltage source such that all wordlines are in a deactivated state, and determining the reference value by measuring a current on at least one wordline in a deactivated or precharged state.

10. The method of claim 9, and further comprising storing the reference value in the memory device, and wherein measuring and comparing are performed in said memory device.

11. The method of claim 8, wherein (b) measuring and (c) comparing are performed in a device external to said memory device.

12. The method of claim 8, and further comprising determining that a selected wordline has a defect when the measured current for the selected wordline is greater than the reference value.

13. The method of claim 8, wherein for a wordline whose measured current exceeds the reference value, further comprising applying each of a plurality of different bitline voltages and measuring the current on the wordline at each of the plurality of different bitline voltages to distinguish a wordline-wordline short-circuit from a wordline-bitline short-circuit.

14. An intergrated circuit memory device, comprising:
   a. a contact pad for connection to an externally supplied wordline voltage;
   b. an address decoder that selects one of a plurality of wordlines for connection to said contact pad; and
   c. a command decoder that is responsive to a command to disable on-chip wordline voltage generator thereby deactivating the plurality of wordlines to enable measurement of current on a selected wordline as a result of application of said externally supplied wordline voltage.

15. The device of claim 14, and further comprising a current measuring circuit that measures the current on the selected wordline as a result of said externally supplied voltage; a storage element that stores a reference value derived from a measured current on at least one wordline in a deactivated state; and a comparator that compares the measured current on the selected wordline with the reference value to determine whether the selected wordline has a defect.

16. The device of claim 15, wherein the decoder is responsive to a command to configure the current measuring circuit to measure a current on at least one wordline that is in a deactivated or precharged state in order to determine the reference value.

17. In combination, the semiconductor intergrated circuit memory device of claim 14 and a tester device that connects to said intergrated circuit memory device, wherein the tester device comprises a power supply that supplies said externally supplied wordline voltage; a storage element that stores a reference value derived from a measured current on at least one wordline in a deactivated state; and a comparator that compares a measured current on the selected wordline with the reference value to determine whether the selected wordline has a defect.

18. The combination of claim 17, wherein the tester device determines the measured current on the selected wordline based on the amount of current needed to be supplied to the selected wordline to maintain said wordline voltage.

19. The combination of claim 18, wherein the tester device supplies a wordline address to said memory device, and wherein the address decoder is responsive to said wordline address supplied by said tester device to select a corresponding wordline.

20. An intergrated circuit memory device, comprising:
  a. means for receiving an externally supplied wordline voltage;
  b. means for selecting one of a plurality of wordlines for connection to said externally supplied voltage; and
  c. means for decoding responsive to a command to disable an on-chip wordline voltage generator thereby deactivating all wordlines in said memory device to enable measurement of current on a selected wordline as a result of application of said externally supplied wordline voltage.

21. The device of claim 20, and further comprising means for measuring current on the selected wordline as a result of said externally supplied voltage; means for storing a reference value representing a measured current on at least one deactivated wordline; and means for comparing the measured current on the selected wordline with the reference value to determine whether the selected wordline has a short-circuit defect.

22. The device of claim 21, wherein said means for decoding is responsive to a command to configure the current measuring circuit to measure a current on at least one wordline that is in a deactivated or precharged state for determining the reference value.

23. In combination, the intergrated circuit memory device of claim 20 and a tester device that connects to said semiconductor intergrated circuit memory device, wherein the tester device comprises a means for supplying said externally supplied wordline voltage; means for storing a reference value derived from a measured current on at least one wordline in a deactivated state; and means for comparing a measured current on the selected wordline with the reference value to determine whether the selected wordline has a defect.

* * * * *